(12) United States Patent
Hung et al.

(10) Patent No.: US 6,628,550 B1
(45) Date of Patent: Sep. 30, 2003

(54) STRUCTURE, FABRICATION AND OPERATION METHOD OF FLASH MEMORY DEVICE

(75) Inventors: Chih-Wei Hung, Hsin-chu (TW); Chih-Ming Chen, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/064,143

(22) Filed: Jun. 14, 2002

(51) Int. Cl.[7] ............................................. G11C 16/04
(52) U.S. Cl. ............................. 365/185.29; 365/185.33
(58) Field of Search ...................... 365/185.29, 185.33, 365/185.11, 185.28, 185.26

(56) References Cited

U.S. PATENT DOCUMENTS 5,587,332 A * 12/1996 Chang et al. ............... 438/258
5,717,636 A * 2/1998 Dallabora et al. ..... 365/185.13

* cited by examiner

*Primary Examiner*—Thong Le
(74) *Attorney, Agent, or Firm*—Jiang Chyun IP Office (57) ABSTRACT

A structure of a flash memory device. The flash memory comprises a deep n-well formed in a substrate, a p-well in the deep n-well, a stacked gate structure on the substrate, source and drain regions in the substrate at two respective sides of the stacked gate, an n-well extending from the drain region to a position under the stacked-gate structure, an n⁻ pocket doped region under the stacked-gate structure and connected between the n-well and the source region. The flash memory uses avalanche induced hot electron injection for programming, and the F-N tunneling effect to perform erase operation.

33 Claims, 10 Drawing Sheets

STRUCTURE, FABRICATION AND OPERATION METHOD OF FLASH MEMORY DEVICE

BACKGROUND OF THE INVENTION

1. Field of the Invention

The invention relates in general to a non-volatile memory (NVM) device, and more particular, to a structure, a fabrication method and an operation method of a p-channel flash memory device.

2. Related Art of the Invention

Being able to repetitively perform data writing, reading and erasing operations and having the advantage that the written data does not disappear after power down, the flash memory device has become a broadly applied non-volatile memory device in personal computer and electronic equipment.

The typical flash memory device comprises a doped polysilicon floating gate and control gate. During the programming or erasing operation of the flash memory device, appropriate voltages are applied to the drain region, the source region and the control gate, respectively, such that electrons are either injected into the floating gate or pulled out from the floating gate.

Generally speaking, the commonly applied mode for electron injection in a flash memory device includes channel hot-electron injection (CHEI) and Fowler-Nordheim (F-N) tunneling. The ways for programming and erasing are varied according to the injection and pulling modes.

In addition, according to the structure, the flash memory device is divided into the p-channel flash memory device and n-channel flash memory device. Having the properties of higher electron injection efficiency, higher device scalability, immunity of reliability problem caused by hot-hole injection, and lower oxide electric field for electron injection, the p-channel flash memory device has a large potential for further development.

The p-type flash memory device normally uses channel hot-electron (CHE) injection mode to write data into the drain region for programming, and uses F-N tunneling effect to pull out electrons from the channel region for the erase operation.

As the p-channel flash memory uses channel hot-electron injection for programming, the electrons are injected from a position close to the drain region only. Consequently, the electron injection efficiency is low. Normally, a higher voltage is supplied to provide a larger current, so as to increase the programming speed. As the voltage is increased, the reliability of the electronic device is reduced, so that the device shrinkage is limited.

SUMMARY OF THE INVENTION

The present invention provides a structure, a fabrication method and an operation method of a flash memory device to prevent the tunneling oxide from experiencing a very high electric field, so that the lifetime and reliability of the tunneling oxide are improved, and the integration of the flash memory device is increased.

The structure, the fabrication method and the operation method of a flash memory device provided by the present invention further increases the programming speed of the memory cells and reduces the leakage current occurring to the reading operation of the memory cells.

The structure of the flash memory device is thus provided by the present invention. The flash memory device comprises a second conductive type well formed in a first conductive type substrate, a first conductive type well formed in the first well, a stacked-gate structure formed on the substrate, a source region and a drain region formed in the substrate at respective sides of the stacked-gate structure, a second conductive type third well extending from the drain region to a position under the stacked-gate structure and with a distance spaced with the source region, and a second conductive type pocket doped region connected to the third well and the source region under the stacked-gate structure.

An n-well is formed from the side of the drain region. The n-well extends under the stacked-gate structure. A pocket doped region is formed at the side of the source region. Two sides of the pocket doped region are respectively connected to the source region and the n-well. As the pocket doped region has the higher background doping concentration compared to the n-well, and the pocket doped region has a shallow junction, it thus has an avalanche voltage between source and pocket doped region lower than that between the n-well and the source. The voltage applied to the control gate can be lower than 10 V. With the above structure, the flash memory uses avalanche induced hot-electron injection mode for programming, and uses FN tunneling effect for erasing. In addition, by short circuiting the n-well and the drain region, it can provide potential to drain and n-well, which performs read mode operation for p-channel cell.

The present invention further provides a method of fabricating a flash memory device. A first conductive type substrate on which a second conductive type first well, a first conductive type second well, and a stacked-gate structure are sequentially formed is provided. A first patterned photoresist layer that exposes a part of the substrate predetermined for forming a drain region is formed on the substrate. A first pocket ion implantation step is performed to form the exposed part of the substrate for forming a second conductive type third well that extends towards under the stacked-gate structure and is spaced with a part of the substrate predetermined for forming a source region with a distance. The first patterned photoresist layer is removed. A second patterned photoresist layer that exposes the part of the substrate predetermined for forming the source region is formed on the substrate. A second pocket ion implantation step is performed to form a second conductive type pocket doped region in the part of the substrate predetermined for forming the source region. The second patterned photoresist layer is removed. The source region and the drain region are formed in the substrate at two respective sides of the stacked-gate structure. A spacer is formed on a sidewall of the stacked-gate structure. A third patterned photoresist layer that exposes the drain region is formed on the substrate.

The substrate of the drain region is etched until reaching a junction between the drain region and the second conductive type third well, using the third patterned photoresist layer and the tacked-gate structure with the spacer. After removing the third patterned photoresist layer, a first conductive layer is formed over the substrate. The first conductive layer fills the gap space of between the stacked-gate structures and is electrically connected to the source region and the drain region. Then, a of the third conductive layer is removed, so as to form a first contact window at the source region, and a second conductive layer on the second conductive type third well. The second conductive layer is patterned to form a second contact window. The second contact window causes a short circuit between the drain region and the conductive type third well. Then, an interlayer dielectric layer is formed over the substrate and a conductive line is formed on the interlayer dielectric layer to have electrical connection with the second contact window.

The present invention uses a patterned photoresist layer to cover the region predetermined for forming the source region first. Using a tilt-angle ion implantation process, n-type dopant is implanted into the region predetermined for forming the drain region with a tilt implantation angle between 0° to 180°. Therefore, an n-well is formed at the drain side. A thermal process is then performed to drive in the dopants into the substrate, and then the n-well extends under that stacked-gate structure. Another patterned photoresist layer is formed to cover the region predetermined for forming the drain region. Using a tilt-angle ion implantation process with a tilt-angle of 30°, an n$^-$-type dopant is implanted into the predetermined drain region to form an n$^-$ pocket doped region. The n$^-$ pocket doped region has two sides connected to the n-well and the subsequently formed P+ source region, respectively. Using the tilt-angle ion implantation process, the n-well and n$^-$ pocket doped region can be formed at predetermined regions precisely.

The present invention further provides an operation method of a flash memory device suitable for use in a p-channel flash memory device. The p-channel flash memory device has a first n-well formed in a p-type substrate, a p-well formed in the first n-well, a stacked-gate structure formed on the substrate, a source region and a drain region formed in the substrate at two sides of the stacked-gate structure, a second n-well formed in the p-well and extending towards under the stacked gate with a distance spaced from the source region, and an n$^-$ pocket doped region within the distance and having two sides connected to the second n-well and the source region, respectively. The operation method includes the following steps. The stacked-gate structure comprises a control gate and a floating gate. While programming the p-channel flash memory device, a first positive voltage is applied to the control gate and the drain region is grounded. A negative current is applied to the source region. The avalanche is thus applied to cause hot-electron injection to program the p-channel flash memory device. During the erase operation, a negative voltage is applied to the control gate, while the source region is applied with a second positive voltage, the drain region is floated. The F-N tunneling effect is applied to perform the erase operation.

As the present invention uses avalanche breakdown to induce hot-electron injection mode for programming the p-channel flash memory, the programming speed can be maintained at microseconds (lower than 5 microseconds). While programming, the hot holes elapse from the source region without injecting into the tunneling oxide layer, so that the device reliability is improved. Further, the steep junction for the drain region results in a lower channel leakage current of the p-channel flash memory device. As a result, there is no need of a drain junction capable of enduring high voltage, and the device integration is further increased.

The present invention further provides an operation method of a flash memory device to operate a memory cells array. The memory cell array comprises a plurality of memory cells, a plurality of word lines, a plurality of bit lines and a plurality of source lines. The memory cells are arranged in a column/row array. The drain region of each column of the memory cells is coupled to a corresponding bit line. The source region of each row of the memory cells is coupled to a corresponding source line. The gate of each row of the memory cells is coupled to a corresponding word line. During the programming operation, a first positive voltage is applied to the word line coupled to a selected memory cell, while the bit line coupled to the selected memory cell is grounded. Further, a negative current, that is, a negative voltage is connected to a source line coupled to the selected memory cell, and at the same time, the bit line coupled to the non-selected memory cells that share a common word line is floated to prevent the common word line of the non-selected memory cells from being programmed. During the reading process, the word line coupled to the selected memory cell is grounded. A second positive voltage is applied to the bit line coupled to the selected memory cell. Meanwhile, a third positive voltage is applied to a word line coupled to a plurality of non-selected memory cells. While performing erase, a negative voltage is applied to the word line coupled to the selected memory cell, while the bit line is floating and source line coupled to a positive voltage.

In the above programming operation, the common word line for the non-selected memory cells will not be programmed. This is because the bit line coupled thereto is floated, so that breakdown will not be generated at the source region of the non-selected memory cells sharing the common word line. Even though a voltage is applied to the word line, the avalanche breakdown will not occur to cause the hot-electron injection. Consequently, the non-selected memory cells will not be programmed. In addition, the voltage of the word line coupled to other non-selected memory cells is 0V. Therefore, the hot-electron injection caused by breakdown will not occur, so that the non-selected memory cells will not be programmed.

The above program operation uses avalanche breakdown to cause hot-electron injection, so that the programming speed is maintained at microseconds (lower than 5 microseconds). While programming, the hot holes elapse from the source region instead of being injected into the tunneling oxide layer, so that the device reliability is enhanced. Further in the present invention, the p-channel flash memory has a steep junction at the source region without sustaining high voltage. In addition, the device integration of the present invention is also increased.

BRIEF DESCRIPTION OF THE DRAWINGS

These, as well as other features of the present invention, will become more apparent upon reference to the drawings wherein.

DETAILED DESCRIPTION

FIGS. 1A to 1G are elevated views showing the fabrication process of a flash memory device according to the present invention. In this embodiment, a BiNOR flash memory is used as an example for illustration of the present invention.

Figure 1A:
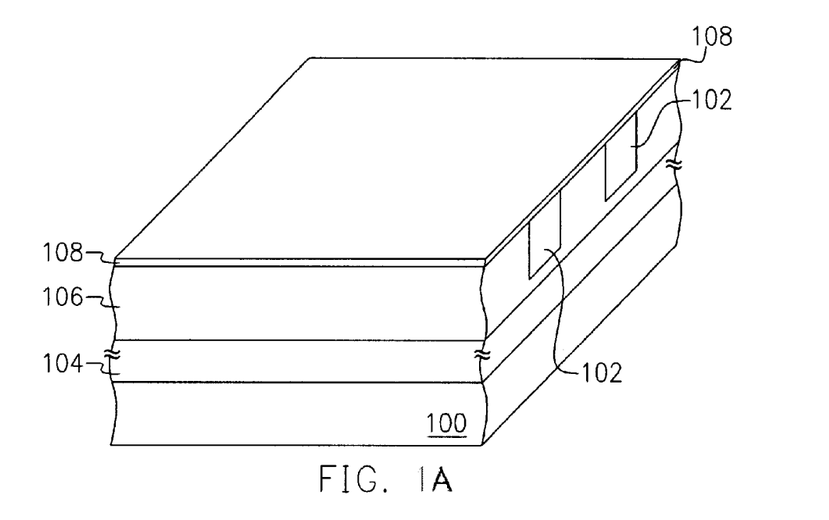
FIGS. 1A to 1I show the fabrication process of the flash memory provided by the present invention.

Referring to FIG. 1A, a substrate 100, for example, a p-type silicon substrate, is provided. An isolation layer 102 is formed in the substrate 100. In this embodiment, the isolation structure 102 is in strip pattern to define an active region. The isolation structure 102 is formed by local oxidation (LOCOS) or shallow trench isolation (STI) processes, for example. A deep n-well 104 is formed in the p-type substrate 100. A p-well 106 is formed in the n-well 104 as a memory cell array region. An oxide layer 108 is formed on the substrate 100 as a tunneling oxide. The method for forming the oxide layer 108 includes thermal oxidation, for example. The thickness of the oxide layer 108 is about 90 angstrom to about 100 angstrom.

Figure 1B:
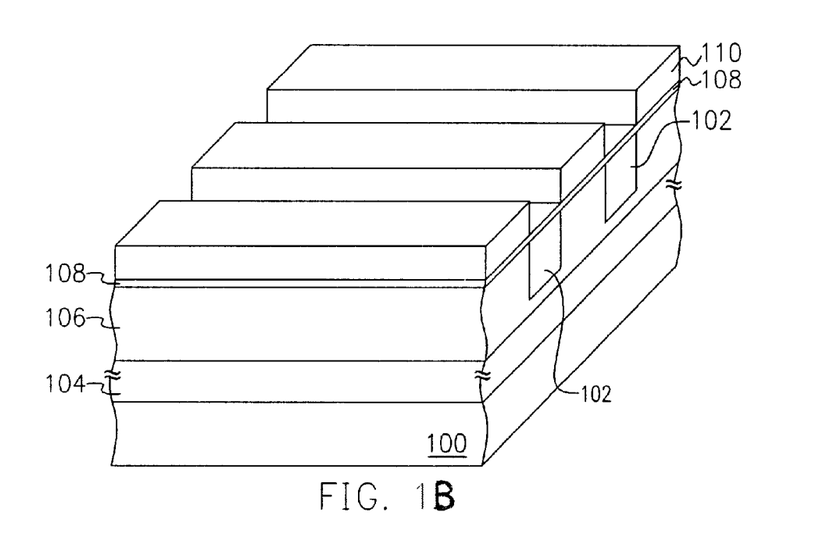

Referring to FIG. 1B, a conductive layer (not shown) is formed on the oxide layer 108. The material of the conductive layer includes doped polysilicon. The conductive layer is formed by performing a chemical vapor deposition to form an undoped polysilicon layer and is doped by implantation, for example. The conductive layer has a thickness of about 800 angstroms. The conductive layer is then patterned into the conductive layer 110 that exposes the surface of the isolation structure 102.

Figure 1C:
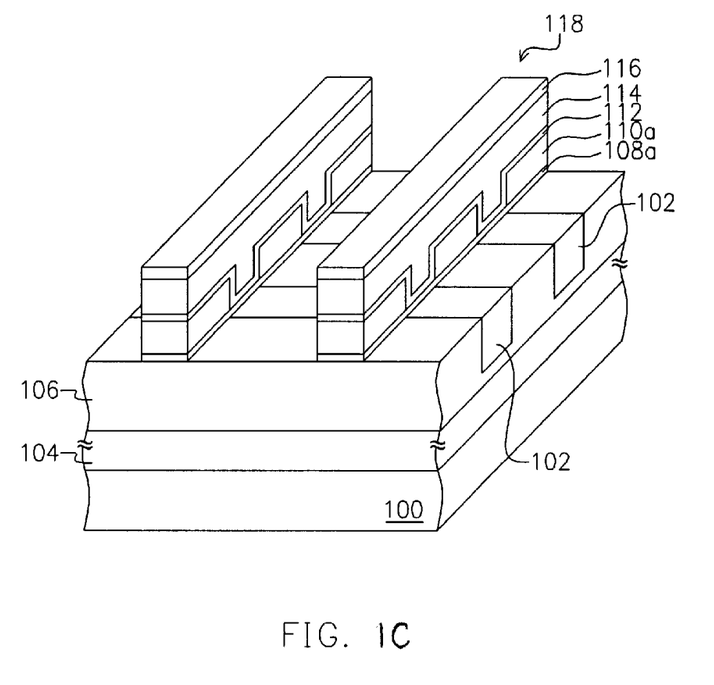

Referring to FIG. 1C, a dielectric layer (not shown), a conductive layer (not shown) and a cap layer (not shown) are sequentially formed. A mask layer is used to pattern the cap layer and the conductive layer into a gate cap layer 116 and a conductive layer 114 used for a control gate. During the step of patterning the conductive layer 114, the same mask is used to pattern the dielectric layer, the conductive layer 110 and the oxide layer 108 for forming the dielectric layer 112, the conductive layer 110a and the oxide layer 108a, where the conductive layer 110a serves as a floating gate. That is, the stacked-gate structure 118 of the flash memory includes the gate cap layer 116, the conductive layer (control gate) 114, the dielectric layer 112, the conductive layer (floating gate) 110a and the oxide layer (tunneling oxide layer) 112a.

The material of the dielectric layer 112 includes oxide/nitride/oxide with a thickness of 60/70/60 angstroms, for example. The method for forming the dielectric layer 112 includes low pressure chemical vapor deposition. Other material such as silicon oxide, oxide/nitride can also be used.

The conductive layer 114 includes doped polysilicon layer with a thickness of about 2000 angstroms. The method for forming the conductive layer 114 includes in-situ doping chemical vapor deposition.

The gate cap layer 116 includes a silicon nitride layer with a thickness of about 1500 angstroms, and the method for forming the gate cap layer 116 includes chemical vapor deposition.

Figure 1D:
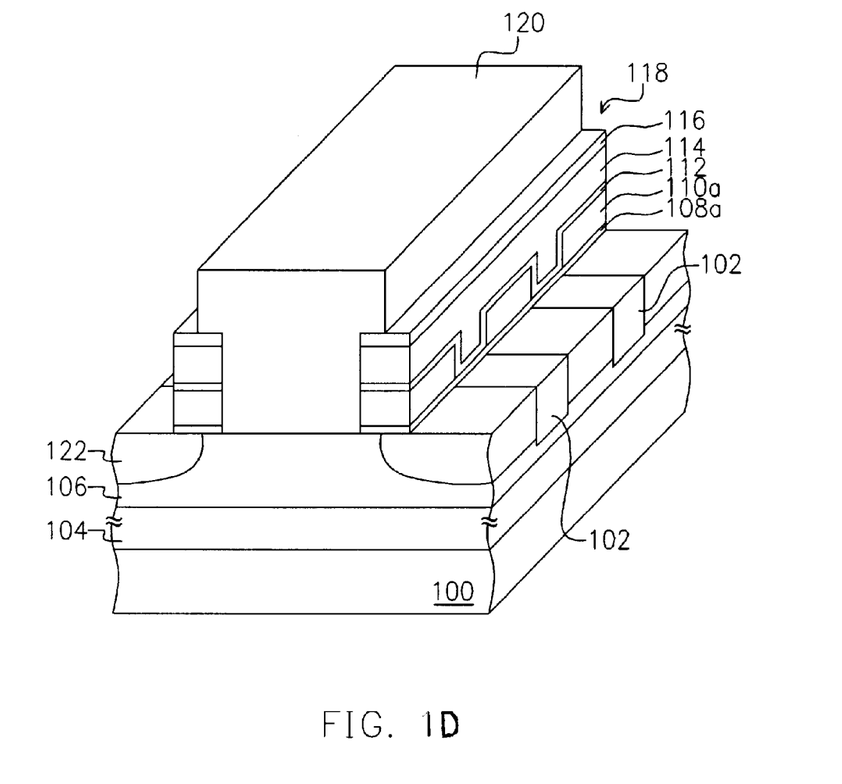

Referring to FIG. 1D, a patterned photoresist layer 120 is formed over the substrate 100. The photoresist layer 120 exposes a part of the substrate predetermined for forming a drain region. A pocket ion implantation step is performed to with the stacked-gate structure 118 and the photoresist layer 120 as a mask. Dopant is implanted into the p-well 106 near the substrate 100 predetermined for forming the drain region to form an n-well 122. The dopants includes phosphoric ion, for example. The implantation energy is about 100 KeV, and the dopant dosage is about $1 \times 10^{13}$ atoms/cm$^2$. The ion implantation step includes a tilt angle ion implantation step with a tilt angle from 0° to 180°. Therefore, the n-well 122 has one side extending under the stacked-gate structure 118 with a distance spaced from the region for forming the drain region. After removing the patterned photoresist layer 120, a thermal process is performed for driving in the dopant in an oxygen environment at a temperature of about 900° C. to drive n-well toward lateral direction.

Figure 1E:
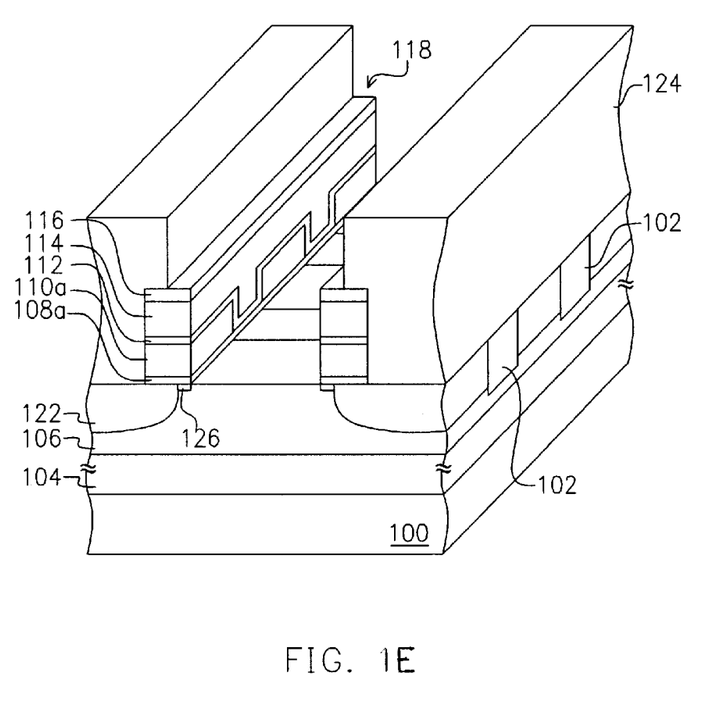

Referring to FIG. 1E, a patterned photoresist layer 124 that exposes a region predetermined for forming a source region is formed over the substrate 100. A pocket ion implantation step is performed with the stacked-gate structure 118 and the patterned photoresist layer 124 as a mask. The p-well 106 under the stacked-gate structure 118 near the source region is thus doped to form an n$^-$ pocket doped region 126. The dopant includes arsenic ion, for example. The implantation energy is about 30 KeV, while the doping concentration is about $1 \times 10^{-}$atoms/cm$^2$. The ion implantation process includes a tilt angle ion implantation process with a tilt implantation angle of about 30°, for example. Therefore, the n$^-$ pocket doped region 126 is located under the stacked-gate structure 118 at the side of the source region, and is connected to the n-well 122. The n$^-$ pocket doped region 126 is formed to adjust the avalanche voltage of the source region. The photoresist layer is then removed.

Figure 1F:
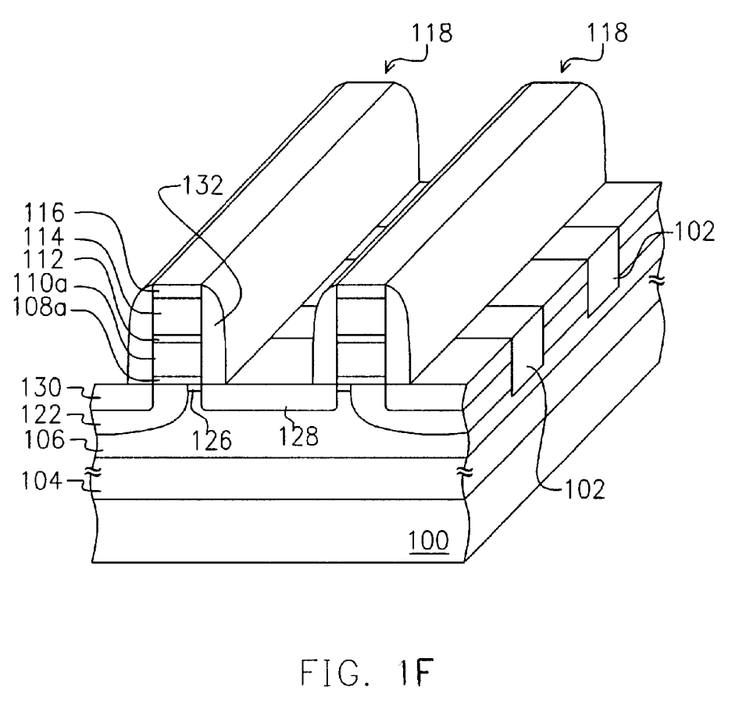

Referring to FIG. 1F, an ion implantation step is performed using the stacked-gate structure 118 as a mask. The substrate 100 at two sides of the stacked-gate substrate 100 is doped to form the source region 128 and the drain region 130. The doped ion includes BF$_2$ with an implantation energy of about 30–50 KeV. The doping concentration is about $3 \times 10^{15}$ atoms/cm$^2$. After forming the source region 128, a side of the n$^-$ pocket doped region 126 is adjacent to the source region 128, and the other side thereof is adjacent to the n-well 122. A spacer 132 is then formed on a sidewall of the stacked-gate structure 118. The method for forming the spacer 132 includes forming an insulation layer (not shown) such as silicon nitride, followed by an anisotropic etching step to remove a part of the insulation layer.

Figure 1G:
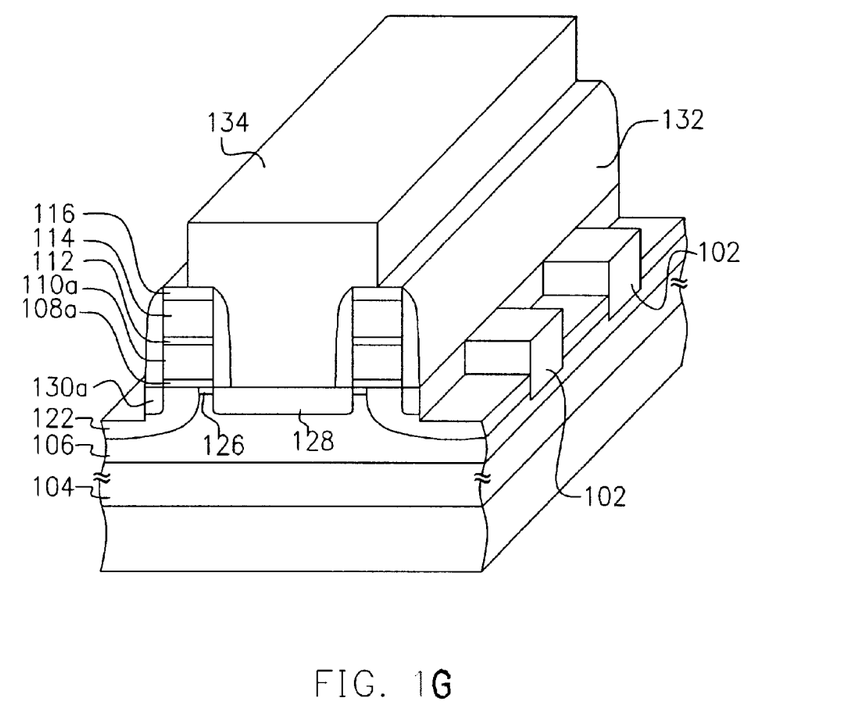

Referring to FIGS. 1G, a patterned photoresist layer 134 that exposes the drain region 130 is formed on the substrate 100. An etching step is performed with the patterned photoresist layer 134 and the stacked-gate structure 118 with the spacer 132 as a mask. The substrate 100 is etched until a surface of the n-well 122 is exposed. Consequently, the drain region 130a is formed. The drain region 130a is located under the spacer 132 such that the contact window formed subsequently will short circuit the drain region 130a and the n-well 122 by penetrating through a junction therebetween. The patterned photoresist layer 134 is then removed. The subsequent process for completing the flash memory is prior art, so that a detailed description is not introduced here.

Figure 1H:
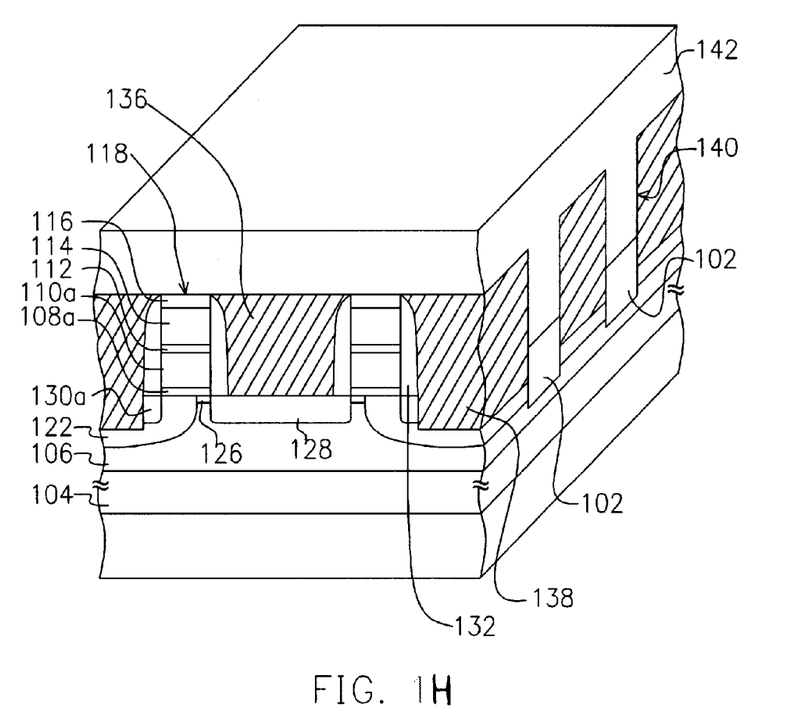

Referring to FIG. 1H, after the patterned photoresist layer 134 is removed, a contact window 136 is formed on the source region 128 between the stacked-gate structures 118, and the contact window 138 on the n-type well region 122 between the stacked-gate structures 118. The contact windows 136 and 138 include, for example, tungsten metal. The formation of the contact windows 136 and 138 includes the method, for example, first forming a conductive layer (not shown) over the substrate 100. The conductive layer fills the gap space between the stacked-gate structures 118. Then, a chemical mechanic polishing process or an etching process is performed until the cap layer 116 of the stacked-gate is exposed. The contact window 136 is formed on the source region 128 between the stacked-gate structures 118, and a conductive layer (not shown) is formed on the n-type well region 122 between the stacked-gate structures 118. The photolithographic and etching processes are performed to remove a portion of the conductive layer on the n-type well region 122, so as to form an opening 140. The opening separates the adjacent memory cells and a contact widow 138 is formed. The contact windoe penetrates the drain region 130a and the junction of the n-type well region 122 so as to have a short path to connect the two parts together.

Then, an interlayer dielectric layer 142 is formed over the substrate 100. The interlayer dielectric layer 142 fills the opening 140. The dielectric layer 142 includes, for example, BPSG or PSG. The method to form the interlayer dielectric layer 142 includes, for example, a chemical vapor deposition. Then, a chemical mechanical polishing process is performed to planarize the interlayer dielectric layer 142.

Figure 1I:
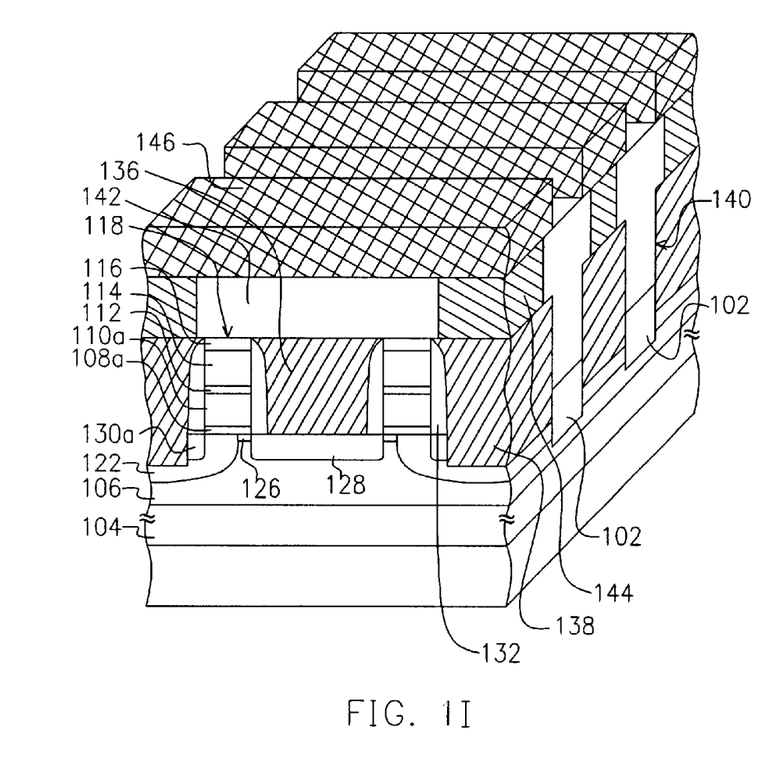

Referring to FIG. 1I, a plug 144 is formed in the interlayer dielectric layer 142 with electric connection with the contact window 138. The plug 144 includes, for example, tungsten metal. The method to form the plug 144 is, for example, first forming an opening (not shown) in the interlayer dielectric layer 142 to expose the contact window 138. Then, a conductive material is filled into the opening. A conductive line is formed on the interlayer dielectric layer 142 with electric contact on the plug 144. The method for forming the conductive line 146 includes, for example, forming a conductive layer (not shown) over the substrate 100. The photolithographic and etching processes are performed to form the conductive line 146. The subsequent processes to accomplish the product should be well known by the skilled artisans and not be further described.

The present invention uses a patterned photoresist layer 120 to cover the region predetermined for forming the source region and uses tilt angle ion implantation with a tilt angle between 0° to 180° to form the n-well region at the side of the drain region. The n-well 122 extends under the stacked-gate structure 118. By performing a thermal process, the dopant in the n-well 122 is further driven in the substrate 100. Another patterned photoresist layer 124 covering a region predetermined for forming a drain region is formed, and a tilt angle ion implantation process with a tilt angle of about 30° is performed to form an n⁻ pocket doped region 126. The n⁻ pocket doped region 126 has two sides connected to the n-well 122 and the source region 128 formed subsequently. The step of tilt ion implantation allows the n-well 122 and the n⁻ pocket doped region formed in the predetermined areas precisely. Two neighboring memory cells can share a common n-well 122. Therefore, the problem of overlapping n-well 122 is resolved, and the device integration is enhanced.

Figure 2:
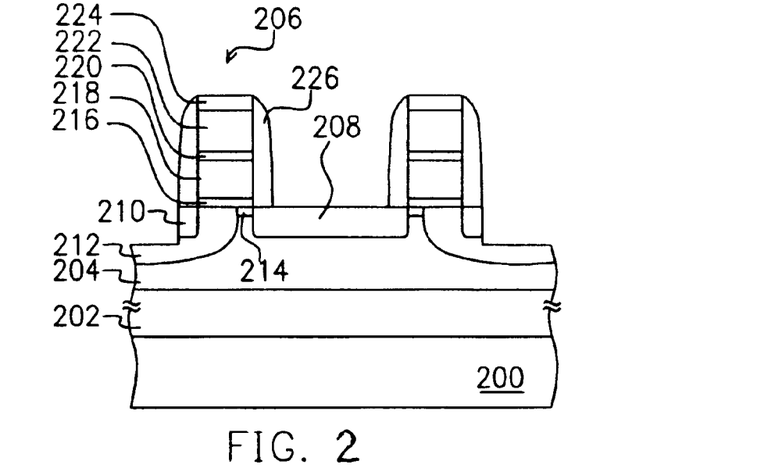
FIG. 2 shows a cross sectional view of the flash memory provided by the present invention.

FIG. 2 shows a cross-sectional view of a flash memory of the present invention.

Referring to FIG. 2, the flash memory includes a p-type substrate 200, a deep n-well 202, a p-well 204, a stacked-gate structure 206, a source region 208, a drain region 210, an n-well 212 and an n⁻ pocket doped region 214. The stacked-gate structure 206 comprises a tunneling oxide layer 216, a floating gate 218, a gate dielectric layer 220, a control gate 222, a gate cap layer 224 and a spacer 226.

The deep n well 202 is located in the p-type substrate 200. The p-well 204 is located in the deep n well 202. The stacked-gate structure 206 is formed on the p-type substrate 200. The source region 208 and the drain region 210 are formed in the p-type substrate 200 at two sides of the stacked-gate structure 206. The n-well 212 is located in the p-well 212 and extends from the drain region 210 towards a position under the stacked-gate structure 206. The n⁻ pocket doped region 214 is formed under the stacked-gate structure 206 and between the source region 208 and the n-well 212.

In the present invention, an n-well 212 is formed at the side of the drain region and extending under the stacked-gate structure 206. An n⁻ pocket doped region 214 is formed at the side of the source region 208 with both sides connected to the source region 208 and the n-well 212. As the n⁻ pocket doped region 214 and the n-well 212 have the same background dosage, while the n⁻ pocket doped region 214 has a junction shallower than that of the n-well 212, and the breakdown voltage of the n⁻ pocket doped region 212 with respect to the P+ source region is lower than that of the n-well 214 with respect to the p-well 204. The voltage applied to the control gate 222 can be lower than about 10 V. By the above structure, the flash memory provided by the present invention can perform program operation under the avalanche induced hot-electron injection mode and erase operation by FN tunneling effect. In addition, the n-well 212 and the drain region 210 are short circuited to each other. As a result, it is convenient for the read operation on the p-channel memory cell and to provide the voltage to the n-well.

Figure 3:
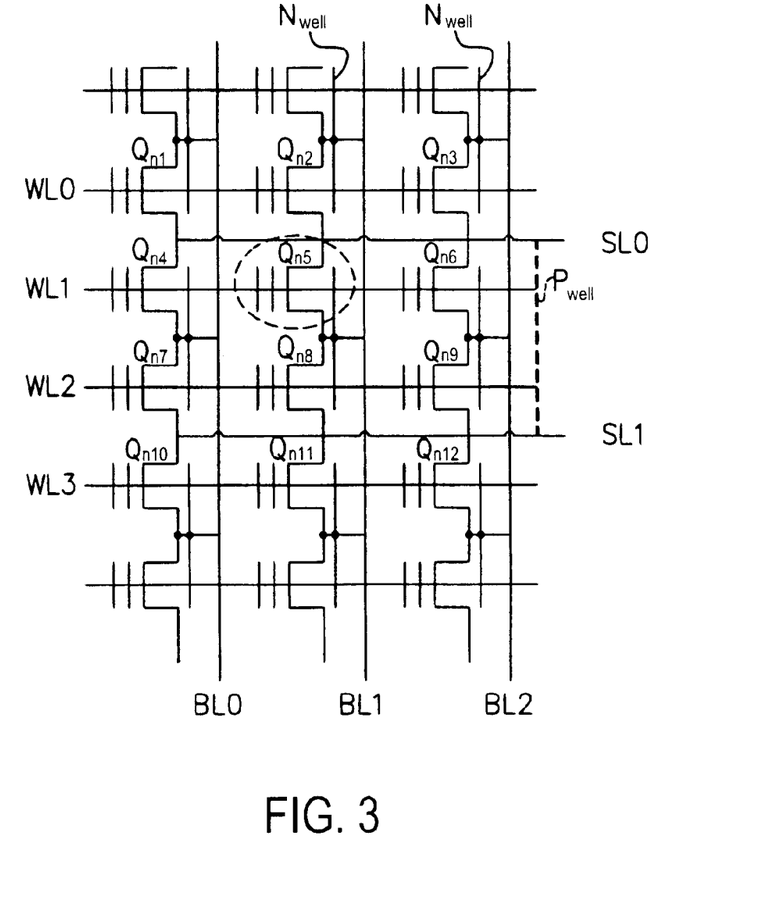
FIG. 3 shows the circuit diagram of a p-type flash memory device of the present invention.

FIG. 3 shows the circuit diagram of the p-type channel flash memory according to the present invention. In this embodiment, a BiNOR array flash memory is used as an example.

In FIG. 3, a plurality of memory cells $Q_{n1}$ to $Q_{n2}$, bit lines BL0 to BL2, and word lines WL0 to WL3 are illustrated. The drain regions of the memory cells $Q_{n1}$, $Q_{n4}$, $Q_{n7}$, $Q_{n10}$ are coupled to the bit line BL0. The drain regions of the memory cells $Q_{n2}$, $Q_{n5}$, $Q_{n8}$, $Q_{n11}$ are coupled to the bit line BL1. The drain regions of the memory cells $Q_{n3}$, $Q_{n6}$, $Q_{n9}$, $Q_{12}$ are coupled to the bit line BL2. The word line WL0 is coupled to the control gates of the memory cells $Q_{n1}$, $Q_{n2}$, $Q_{n3}$. The word line WL1 is coupled to the control gates of the memory cells $Q_{n4}$, $Q_{n5}$, $Q_{n6}$. The word line WL2 is coupled to the control gates of the memory cells $Q_{n7}$, $Q_{n8}$, $Q_{n9}$. The word line WL3 is coupled to the control gates of the memory cells $Q_{n10}$, $Q_{n11}$, $Q_{n12}$. The source regions of the memory cells $Q_{n1}$ and $Q_{n4}$, $Q_{n2}$ and $Q_{n5}$, $Q_{n3}$ and $Q_{n6}$ share a common source line SL0, while the source regions of the memory cells $Q_{n7}$ and $Q_{n10}$, $Q_{n8}$ and $Q_{n11}$, $Q_{n9}$ and $Q_{n12}$ share a common source line SL1. The source lines SL0 and SL1 are conducted to the p-well $p_{well}$ and have the same potential. Each of the memory cells $Q_{n1}$ to $Q_{n12}$ further comprises the n-well extending from the drain region thereof under the stacked-gate structure.

Figure 4A:
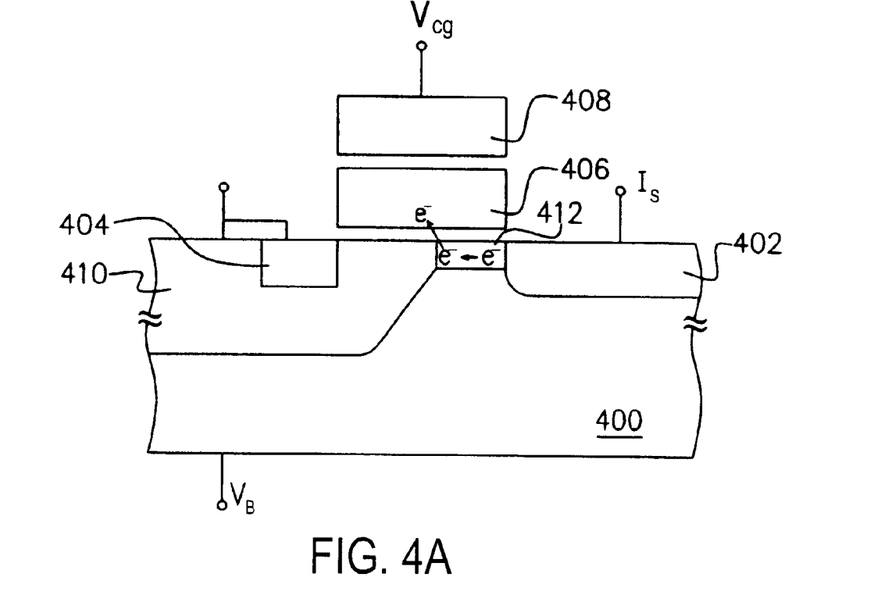
FIG. 4A shows the program operation of the p-type flash memory device according to the present invention.
Figure 4B:
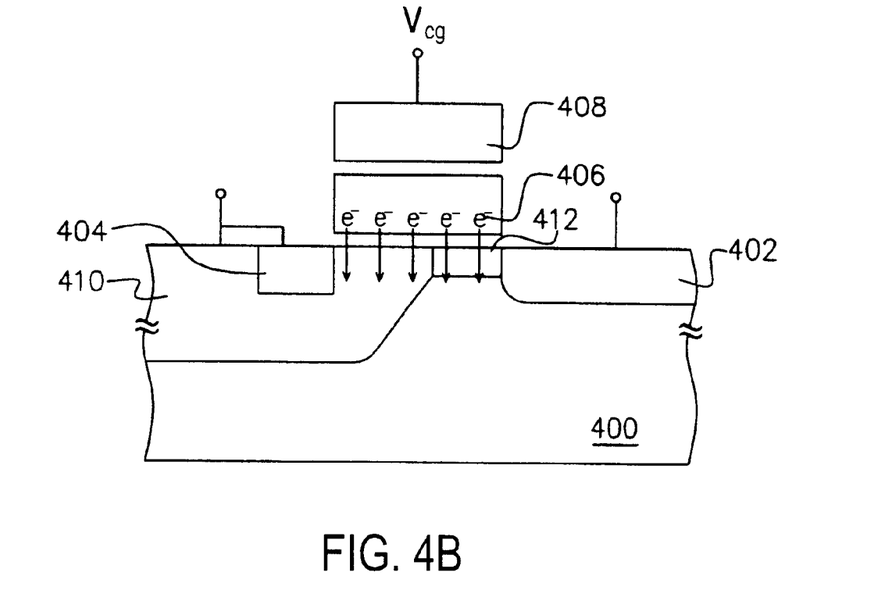
FIG. 4B shows the erase operation of the p-type flash memory device provided by the present invention.

Referring to table 1, FIGS. 4A and 4B, an operation mode of the p-channel flash memory device is illustrated. The operation includes the program operation (as shown in FIG. 4A), the read operation and the erase operation (FIG. 4B). The memory cell $Q_{n5}$ as shown in FIG. 3 is used as an example for performing these operations.

[t1]

TABLE 1

|  | Programming | Reading | Erasing |
| --- | --- | --- | --- |
| Select bit line BL1 | Grounded | $V_d$ | Floating |
| Not selected bit line BL0, BL2 | Floating | Floating | Floating |
| Select word line WL1 | $+V_{cg}$ | Grounded | $-V_{cg}$ |
| Not select word line WL0 · WL2 · WL3 | Grounded | $V_{cc}$ | Grounded |
| Select source line SL0 | $-I_s$ | Grounded | $+V_s$ |
| Not select source line SL1 | Float | Grounded | Float |

While programming the memory cell $Q_{n5}$, a positive bias $V_{cg}$ such as a range of 8 V to 10V is applied to the control gate 408 (WL1). A negative current $I_s$ such as 100 μA is connected to the source region 402 (SL0). Thus, during program operation, the negative current applied to the source region 402 allows the electrons gaining dynamic energy from the electric field of the depletion region to bombard the atoms to form electron-hole pairs. The bombardment of the carriers carries sufficient energy to generate a lot of hot carriers. Thus, when a voltage is applied to the control gate 408, a vertical electric field is built up between the floating gate 406 and the source region 402. The avalanche induced hot electron injection is applied for the electrons to tunnel through the tunneling oxide layer and injected into the floating gate 406 as shown in FIG. 4A. In the present invention, the $n^-$ pocket doped region 412 formed between the n-well 410 and the source region 402 with the shallower junction results in a lower avalanche voltage for n− to p+.

In the above program operation, the memory cells $Q_{n4}$ and $Q_{n6}$ will not be programmed. This is because the bit lines BL0 and BL2 are floated and no avalanche will occur to the source regions of the memory cells $Q_{n4}$ and $Q_{n6}$. Even if a voltage is applied to the word line WL1, the avalanche cannot occur to induce the hot-electron injection. Therefore, the memory cells $Q_{n1}$ and $Q_{n6}$ will not be programmed.

In addition, the voltage of the word line WL0 connected to the memory cells $Q_{n1}$, $Q_{n2}$, $Q_{n3}$, the word line WL2 connected to the memory cells $Q_{n7}$, $Q_{n8}$, $Q_{n9}$, and word line WL3 of the memory cells $Q_{n10}$, $Q_{n11}$, $Q_{n12}$ is 0V. Thus, an avalanche inducing the phenomenon of hot electron injection would not occur for the memory cells $Q_{n1}$ to $Q_{n3}$ and the memory cells $Q_{n7}$ to $Q_{n12}$. This is because the tungsten wire, with respect to the same BL, is tripped into the source line so that the resistance is small. When the memory cell $Q_{n5}$ is programmed, the source line SL0 is applied with a negative current (that is a negative voltage), so that the breakdown will only occur at the source side of the memory cells $Q_{n2}$ and $Q_{n5}$ belonging to the common source line SL0. The word line WL0 of the memory cell $Q_{n2}$ is not applied with any voltage. Thus, the avalanche inducing the phenomenon of hot electron injection would not occur for the memory cell $Q_{n2}$. In addition, since the p-type well has resistance of about 2K ohms, the current on the bit line BL0 almost cannot flow through the p-type well. Since the side of the source region of the memory cells $Q_{n8}$ through $Q_{11}$ still needs to cross the p-type well with 2K ohms, it needs a higher breakdown voltage. This results in that the hot electrons induced by the accumulated breakdown will not cause the phenomenon of injection, and therefore the memory cells $Q_{n7}$ through $Q_{n12}$ are then not programmed.

While performing the reading operation of the memory cell $Q_5$, the reading bias setup is as follows. The bias of the bit line BL1 (the drain region 402) is $V_d$, for example, between 1.5V to 3.3V. The word line WL1 (the control gate 408) and the source line SL0 (the source region 404) are grounded. The bias for the other word lines WL0, WL2 and WL3 has a bias of Vcg, such as about 3.3V. As the channels of the memory cells of which floating gates 406 contain electrons are off and the current is small, and the channels of the memory cells of which the floating gates 406 do not contain electrons are on with a large current, so that whether the digital information of the memory cells is 0 or 1 can be determined according to the on/off status and current magnitude of the channels.

While perform erase operation of the memory cell $Q_{n5}$, a negative voltage $V_{cg}$ such as 10V is applied to the control gate 408 thereof. The source line SL0 (source region 404) is applied with a positive bias Vs, such as about 10 volts. The drain region 402 and the substrate 400 are floated. The source region 404 (10 volts, P+ type) will cause the n-well to be charged up to 10 V, so as to cause a p-n connection. Thus, a large electric field is established between the floating gate 406 and the substrate 400. The FN tunneling effect is thus utilized to pull the electrons from the floating gate 406 through the channel as shown in FIG. 4B.

In the flash memory device of the present invention, an n-well formed at the side of the source region is connected with the drain region by a short circuit, so that it is convenient for the access operation on the p-channel of the memory cell, and can provide the bias to the n-well. Further, a pocket doped region is formed at the side of the source region with both sides connected to the P+ source region and the n-well, respectively. So, we can adjust pocket dosage and energy to achieve lower avalanche voltage with a shallower junction. Thus, during the program operation of the flash memory device, the voltage applied to the control gate can be lower than 10V.

As the program operation of the p-channel flash memory device can be performed under an avalanche induced hot electron injection mode, the programming speed can be maintained at microseconds (lower than 5 microseconds). Further, while performing programming, the hot holes can be elapsed from the source region instead of tunneling through the tunneling oxide layer, so that the device reliability is enhanced. The steep junction occurs at the source region and the side of the source region of the p-channel flash memory device provided by the present invention. The invention is not like the conventional p-channel memory cell, which needs a junction structure for enduring the high voltage at rge side of the source region. As a result, the device integration is increased thereby.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A structure of a flash memory device, comprising:
   a first conductive type substrate;
   a second conductive type first well formed in the substrate;
   a first conductive type second well formed in the first well;
   a stacked-gate structure, formed on the substrate;
   a source region and a drain region formed in the substrate at two sides of the stacked-gate structure, respectively;
   a second conductive type third well, formed in the second well and extending from the drain region towards a position under the stacked-gate structure and spaced from the drain region with a distance; and
   a second conductive type pocket doped region, under the stacked-gate structure with two sides connected to the third well and the source region, respectively.

2. The structure according to claim 1, wherein the first conductive type substrate includes a p-type substrate.

3. The structure according to claim 1, wherein the second conductive type first well and third well include n-wells.

4. The structure according to claim 1, wherein the first conductive type second well includes a p-well.

5. The structure according to claim 1, wherein the second conductive type pocket doped region includes an $n^-$ pocket doped region.

6. The structure according to claim 1, wherein the source region and the drain region are doped with p-type ions.

7. The structure according to claim 1, wherein the drain region and the third well are short circuited with each other.

8. The structure according to claim 7, wherein a contact window is formed to penetrate through a junction between the drain region and the third well.

9. The structure according to claim 1, wherein the pocket doped region and the third well have the same doping concentration.

10. A method of fabricating a flash memory device, comprising:

providing a first conductive substrate, on which a second conductive first well, a first conductive type second well and a stacked-gate structure are sequentially formed;

forming a first patterned photoresist layer that exposes a region of the substrate predetermined for forming a drain region on the substrate;

performing a first pocket ion implantation step to form a second conductive type third well in the region of the substrate predetermined for forming the drain region, the third well extending under the stacked-gate structure and spaced from a region of the substrate predetermined for forming a source region with a distance;

removing the first patterned photoresist layer;

forming a second patterned photoresist layer that exposes the region of the substrate predetermined for forming the source region on the substrate;

performing a second pocket ion implantation step to form a second conductive type pocket doped region under the stacked-gate structure close to the region of the substrate predetermined for forming the source region;

removing the second patterned photoresist layer; forming the source region and the drain region in the substrate at two sides of the stacked-gate structure;

forming a spacer on a sidewall of the stacked-gate structure;

forming a third patterned photoresist layer that exposes the drain region on the substrate; and etching the substrate at the drain region, using the third patterned photoresist layer and the stacked-gate structure with the spacer as a mask, through a junction between the drain region and the third well;

removing the third patterned photoresist layer;

forming a first conductive layer over the substrate, which fills a space gap between the stacked-gate structures and is electrically coupled to the source region and the drain region;

removing a portion of the first conductive layer, so as to form a first contact window at the source region and a second conductive layer disposed at the second conductive type third well;

patterning the second conductive layer, so as to form a second contact window, wherein the second contact window forms a short circuit between the drain region and the second conductive type third well;

forming an interlayer dielectric layer over the substrate; and forming a conductive line over the interlayer dielectric layer, wherein the conductive line is electrically coupled to the second contact window.

11. The method according to claim 10, wherein the first pocket ion implantation step includes a tilt angle ion implantation step.

12. The method according to claim 10, wherein the first pocket ion implantation step is performed with a tilt angle between 0° to about 180°.

13. The method according to claim 10, wherein the second pocket ion implantation step includes a tilt angle ion implantation step.

14. The method according to claim 10, wherein the second pocket ion implantation step is performed with a tilt angle of about 30°.

15. The method according to claim 10, further comprising a step of dopant drive-in after the first pocket ion implantation step and before the step of removing the first patterned photoresist layer.

16. The method according to claim 10, further comprising a step of forming a contact window which short circuits the drain region and the third well.

17. The method according to claim 10, wherein the step of providing a first conductive type substrate includes providing a p-type substrate.

18. The method according to claim 10, wherein the step of forming the second conductive type first well and third well includes forming n-wells.

19. The method according to claim 10, wherein the step of forming the first conductive type second well includes forming a p-well.

20. The method according to claim 10, wherein the step of forming the second conductive type pocket doped region includes forming an $n^-$ pocket doped region.

21. A method of operating a flash memory device, suitable for use in a p-channel flash memory device, the p-channel flash memory device having a p-type substrate, a first n-well in the p-type substrate, a p-well in the first n-well, a stacked-gate structure having a control gate on the substrate, a source region and a drain region in the substrate at two sides of the stacked-gate structure, a second n-well in the p-well extending from the drain region towards a position under the stacked-gate structure and spaced from the source region with a distance, and an $n^-$ pocket doped region under the stacked-gate structure with two sides connected to the second n-well and the source region, respectively, the method comprising:

applying a first positive voltage to the control gate, connecting the drain region to ground, and connecting a negative current to the source region to use avalanche induced hot-electron injection for programming the p-channel flash memory device; and applying a negative voltage to the control gate, floating the drain region, and applying a second positive voltage to the source region to use Fowler-Nordheim tunneling effect for performing erasing operation of the p-channel flash memory device.

22. The method according to claim 21, wherein the step of applying the first positive voltage includes applying a positive voltage between 8V to 10V.

23. The method according to claim 21, wherein the step of connecting the negative current including connecting a negative current of $-100\ \mu A$.

24. The method according to claim 21, wherein the step of applying the negative voltage includes applying a negative voltage of 10V.

25. The method according to claim 21, wherein the step of applying the negative voltage includes applying the second positive voltage of 10V.

26. A method of operating a flash memory device for operating a memory cell array, the memory cell array including a plurality of memory cells, a plurality of word lines, a plurality of word lines and a plurality of source lines, wherein the memory cells are arranged in a column/row array with drain regions of each column of the memory cells coupled to the corresponding bit line, the source regions of each row of the memory cells coupled to the corresponding source line, and the control gates of each row of the memory cells coupled to the corresponding word line, the method comprising:

during a programming operation, applying a first positive voltage to a word line coupled to a selected memory cell, connecting a bit line coupled to the selected memory cell to ground, and connecting a negative current to a source line coupled to the selected memory cell, and floating the bit lines coupled to a plurality of non-selected memory cells sharing the word line to prevent the non-selected memory cells from being programmed;

during a reading operation, applying a second positive voltage to the word line coupled to the selected memory cell, and applying a third positive voltage to the word lines coupled to a plurality of non-selected memory cells; and during an erase operation, applying a negative voltage to the word line coupled to the selected memory cell, connecting the bit line with respect to the selected memory cell to ground, and applying a fourth positive voltage to the source line connected to the selected memory cell.

27. The method according to claim 26, wherein each of the memory cell comprises:

a p-type substrate;

a first n-well in the p-type substrate;

a p-well in the first n-well;

a stacked-gate structure on the p-type substrate, the stacked-gate structure having a control gate;

a source region and a drain region, in the substrate at two sides of the stacked-gate substrate;

a second n-well, in the p-well extending from the drain region towards a position under the stacked-gate structure and spaced from the source region with a distance; and an n⁻ pocket doped region under the stacked-gate structure with two sides connected to the second n-well and the source region, respectively.

28. The method according to claim 26, wherein the step of applying a first positive voltage includes applying a positive voltage between 8V to 10V.

29. The method according to claim 26, wherein the step of connecting a negative current includes connecting a negative current of about −100 $\mu$A.

30. The method according to claim 26, wherein the negative voltage being applied is about 10V.

31. The method according to claim 26, wherein the second positive voltage is about between 1.5V and 3.3V.

32. The method according to claim 26, wherein the third positive voltage is about 3.3V.

33. The method according to claim 26, wherein the third positive voltage is about 10V.

* * * * *